United States Patent
Ba et al.

(10) Patent No.: US 9,007,109 B2
(45) Date of Patent: Apr. 14, 2015

(54) AUTOMATIC LOOP-BANDWIDTH CALIBRATION FOR A DIGITAL PHASED-LOCKED LOOP

(71) Applicant: Nvidia Corporation, Santa Clara, CA (US)

(72) Inventors: Seydou Ba, Richardson, TX (US); Abdellatif Bellaouar, Richardson, TX (US); Ahmed R Fridi, Richardson, TX (US)

(73) Assignee: Nvidia Corporation, Santa Clara, CA (US)

( * ) Notice: Subject to any disclaimer, the term of this patent is extended or adjusted under 35 U.S.C. 154(b) by 126 days.

(21) Appl. No.: 13/888,490

(22) Filed: May 7, 2013

(65) Prior Publication Data
US 2014/0333351 A1    Nov. 13, 2014

(51) Int. Cl.
H03L 7/093 (2006.01)
H03L 7/085 (2006.01)

(52) U.S. Cl.
CPC ............. H03L 7/085 (2013.01); H03L 7/093 (2013.01)

(58) Field of Classification Search
CPC ........................................ H03L 7/093
USPC ............. 327/147, 150, 156, 159; 331/15–17; 375/373, 376
See application file for complete search history.

(56) References Cited

U.S. PATENT DOCUMENTS

| | | | |
|---|---|---|---|
| 8,058,915 B2* | 11/2011 | Chiu et al. | 327/156 |
| 8,836,434 B2* | 9/2014 | Bellaouar et al. | 331/16 |
| 8,860,478 B2* | 10/2014 | Chen et al. | 327/156 |
| 2010/0327912 A1 | 12/2010 | Chiu et al. | |

OTHER PUBLICATIONS

Foreign Communication from a Related Counterpart Application; German Application No. 10 2013 013 194.4; German Examination Report dated Jan. 30, 2014; 12 pages.

* cited by examiner

*Primary Examiner* — Patrick O'Neill

(57) ABSTRACT

A phase-locked loop digital bandwidth calibrator includes a digital loop filter having a gain multiplier memory and a perturbation unit configured to generate a calibration offset signal to initiate a calibration. Additionally, the phase-locked loop digital bandwidth calibrator also includes a digital bandwidth calibration unit configured to provide a corrected nominal gain for storage in the gain multiplier memory, wherein a digital gain correction for the corrected nominal gain is determined by a digital integration stage and a correction database. A phase-locked loop digital bandwidth calibration method is also provided.

18 Claims, 4 Drawing Sheets

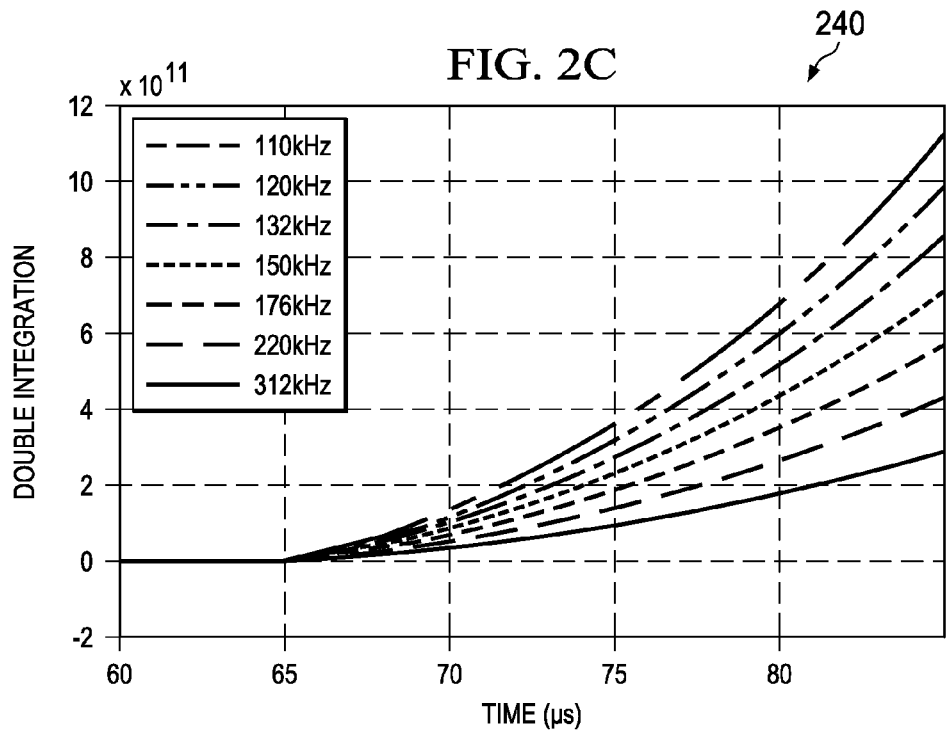
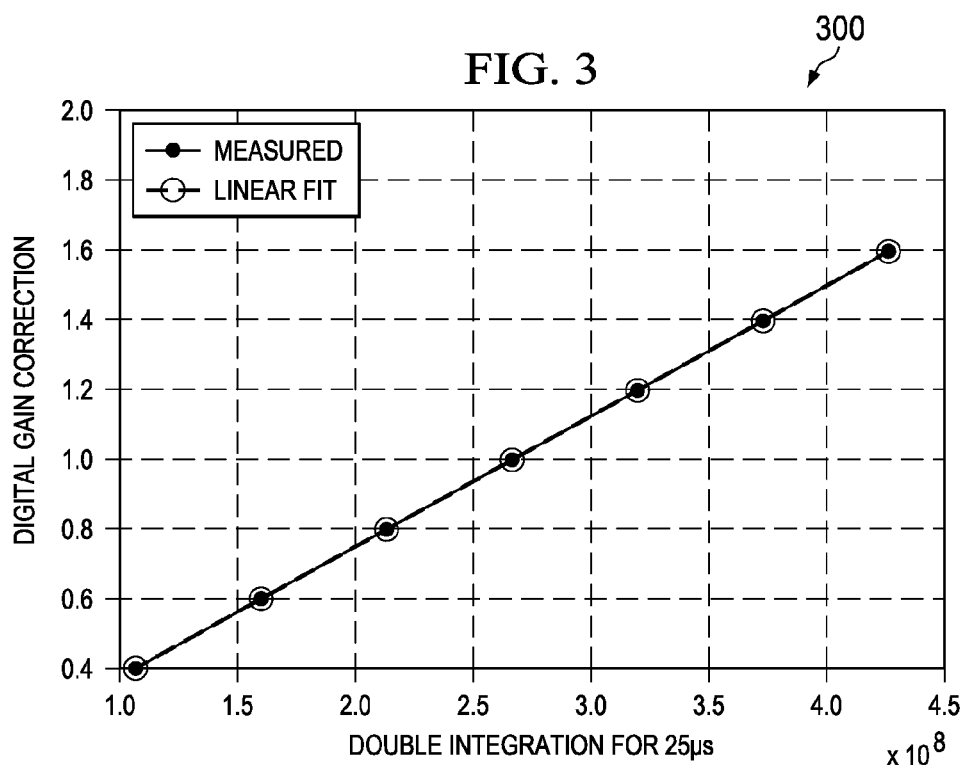

AUTOMATIC LOOP-BANDWIDTH CALIBRATION FOR A DIGITAL PHASED-LOCKED LOOP

TECHNICAL FIELD

This application is directed, in general, to a phase-locked loop and, more specifically, to a phase-locked loop digital bandwidth calibrator and a phase-locked loop digital bandwidth calibration method.

BACKGROUND

A critical issue in the design of phase-locked loops (PLLs) is the variation in PLL loop bandwidth across process, voltage and temperature (PVT) variations. For an un-modulated PLL, a decrease in this bandwidth yields a longer settling time while an increase in bandwidth translates to degraded phase noise performance. In the case of a modulated PLL, a pre-emphasis filter emulating the inverse transfer function of the PLL is typically used to ensure a flat amplitude and group delay response of a transmit chain, for example, within the bandwidth of interest. Bandwidth mismatch between the PLL and the pre-emphasis filter impacts the RMS phase error of Gaussian minimum shift key (GMSK) modulation, wherein the smaller the PLL bandwidth, the higher the impact of bandwidth mismatch. Consequently, even a relatively small variation in the PLL loop bandwidth can result in significant performance degradation. Therefore, improvements in PLL loop bandwidth calibration would be beneficial to the art.

SUMMARY

Embodiments of the present disclosure provide a phase-locked loop digital bandwidth calibrator and a phase-locked loop digital bandwidth calibration method.

In one embodiment, the phase-locked loop digital bandwidth calibrator includes a digital loop filter having a gain multiplier memory and a perturbation unit configured to generate a calibration offset signal to initiate a calibration. Additionally, the phase-locked loop digital bandwidth calibrator also includes a digital bandwidth calibration unit configured to provide a corrected nominal gain for storage in the gain multiplier memory, wherein a digital gain correction for the corrected nominal gain is determined by a digital integration stage and a correction database.

In another aspect, the phase-locked loop digital bandwidth calibration method includes providing digital loop filtering that employs a gain multiplier memory and initiating a calibration by generating a calibration offset signal. The method also includes providing a corrected nominal gain for storage in the gain multiplier memory, wherein a digital gain correction for the corrected nominal gain is determined by digital integration and a stored correction quantity.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIGS. 2A, 2B and 2C illustrate examples of calibration waveforms as may be generated in a PLL, such as the PLL of FIG. 1 during a calibration operation;

FIG. 3 illustrates an example of a required gain correction as a function of the double integration result shown in FIG. 2C for the time period of 25 microseconds.

DETAILED DESCRIPTION

Embodiments of the present disclosure provide a completely digital loop bandwidth calibration approach for digital PLLs that allows a fast and accurate loop bandwidth correction, while maintaining a cost effective implementation. Unlike approaches requiring additional analog components (e.g., charge-pump and data converters), complex processing of analog signals or high frequency RF signals (e.g., involving a VCO output), this entirely digital domain calibration operates by processing digital loop filter signals and adjusting a digital gain parameter.

The calibration approach measures a response of the PLL to a unit step input. The unit step input can be achieved by quickly changing a feedback divide ratio or digitally adding an offset to a VCO control signal. As soon as the input step is applied, a digital double integration operation is carried out for a determined duration, wherein the double integration may be implemented as a cascade of two digital accumulators. As another key feature, it has been experimentally verified that for a selected minimum measurement time, the output of the double integration is inversely proportional to the inverse of the loop-bandwidth. In one embodiment, a database or memory (e.g., look-up table) is used to determine a gain correction, which is then applied to a digital gain control of a digital loop filter in the PLL.

Figure 1:
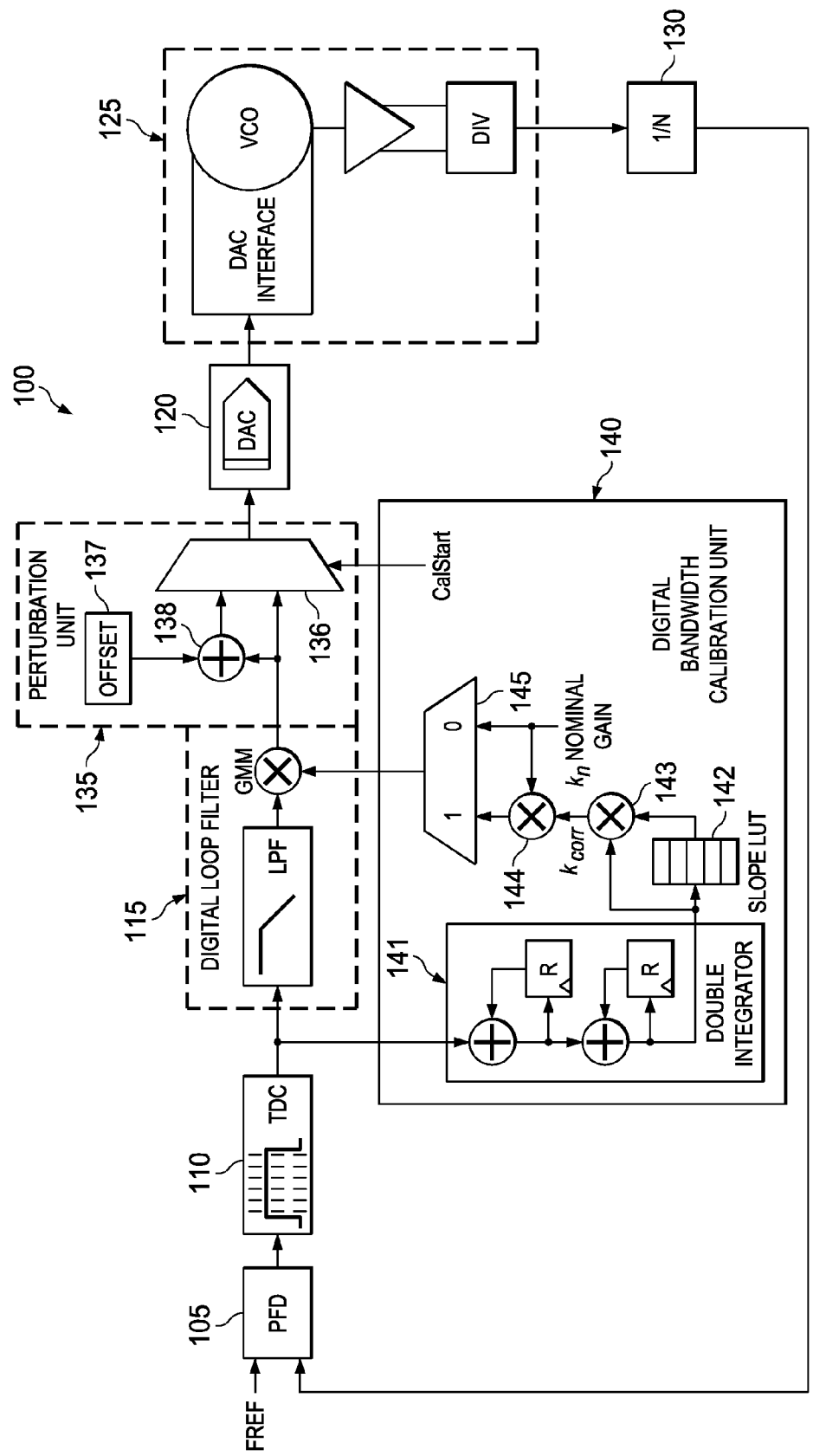
FIG. 1 illustrates a block diagram of an embodiment of a phase-locked loop constructed according to the principles of the present disclosure.

FIG. 1 illustrates a block diagram of an embodiment of a phase-locked loop, generally designated 100, constructed according to the principles of the present disclosure. The phase-locked loop (PLL) 100 may be employed as a modulated PLL and includes a phase detector 105, a phase quantizer 110, a digital loop filter 115 employing a low pass filter (LPF) and having a gain multiplier memory (GMM); a digital to analog converter (DAC) 120, a voltage controlled oscillator (VCO) stage 125 and a feedback divider 130. The PLL 100 also includes a perturbation unit 135 and a digital bandwidth calibration unit 140.

The phase detector 105 compares an input signal having a reference input frequency ($F_{REF}$) to a feedback signal from the VCO stage 125 to provide a phase error between the two. The phase error is quantized in the phase quantizer 110 and provided to the digital loop filter 115 for low pass filtering. During normal operation, the filtered phase error (a digital quantity) is provided to the DAC 120 for conversion to a filtered analog phase error voltage, which is then provided to the VCO stage 125 to determine a VCO stage output frequency. The VCO stage output frequency is further divided by the feedback divider 130 to provide the feedback signal to the phase detector 105.

The perturbation unit 135 includes a direct (i.e., inline) multiplexer 136, a digital offset generator 137 and a calibration offset summing junction 138. The digital bandwidth calibration unit 140 includes a digital integration stage 141 employing a double integrator, a correction database 142 in the form of a slope look-up table (LUT), a first calibration multiplier 143, a second calibration multiplier 144 and a calibration multiplexer 145.

In the illustrated embodiment, a calibration operation measures a response to a unit step (i.e., a step function) input for the PLL 100. The unit step input is achieved by digitally adding a digital offset from the digital offset generator 137 through the calibration offset summing junction 138 to a VCO control signal for the VCO stage 125. Here, the perturbation unit 135 generates a calibration offset signal at initiation of the calibration operation. Alternately, the unit step may be applied by changing a divide ratio in the feedback divider 130. Since the loop bandwidth depends on the divide ratio, the digital offset is a preferable option for the digital PLL 100.

During the calibration operation of the PLL 100, an initial loop gain is set to a value that is larger than nominal (e.g., a loop filter gain of the digital loop filter 115 is set to a value that is about four times its nominal value) to facilitate a faster calibration. After waiting for a fixed time duration to allow the PLL to settle, the direct multiplexer 136 is programmed to select the offset-free path directly from the digital loop filter 115 and a digital double integration operation is concurrently enabled on an input signal of the digital loop filter 115 for a predetermined time duration (e.g., 10 microseconds).

Generally, the digital bandwidth calibration unit 140 provides a corrected nominal gain for storage in the gain multiplier memory (GMM) of the digital loop filter 115, wherein a digital gain correction $k_{corr}$ for the corrected nominal gain is determined by the digital integration stage 141 and the correction database 142. Once the unit step input is applied through the direct multiplexer 136 (controlled by a CalStart command from the digital bandwidth calibration unit 140), the digital integration stage 141 is reset and activated for a specified time duration. A double integration result is used to select a slope in the slope LUT 142. The slope is applied to the double integration result to get the digital gain correction $k_{corr}$ in the first calibration multiplier 143. A nominal digital gain $k_n$ is then multiplied by the digital gain correction $k_{corr}$ in the second calibration multiplier 144 to provide the corrected nominal gain. The corrected nominal gain is applied through the calibration multiplexer 145 for storage in the gain multiplier memory (GMM) of the digital loop filter 115 and future use during normal operation of the PLL 100.

Figure 2A:
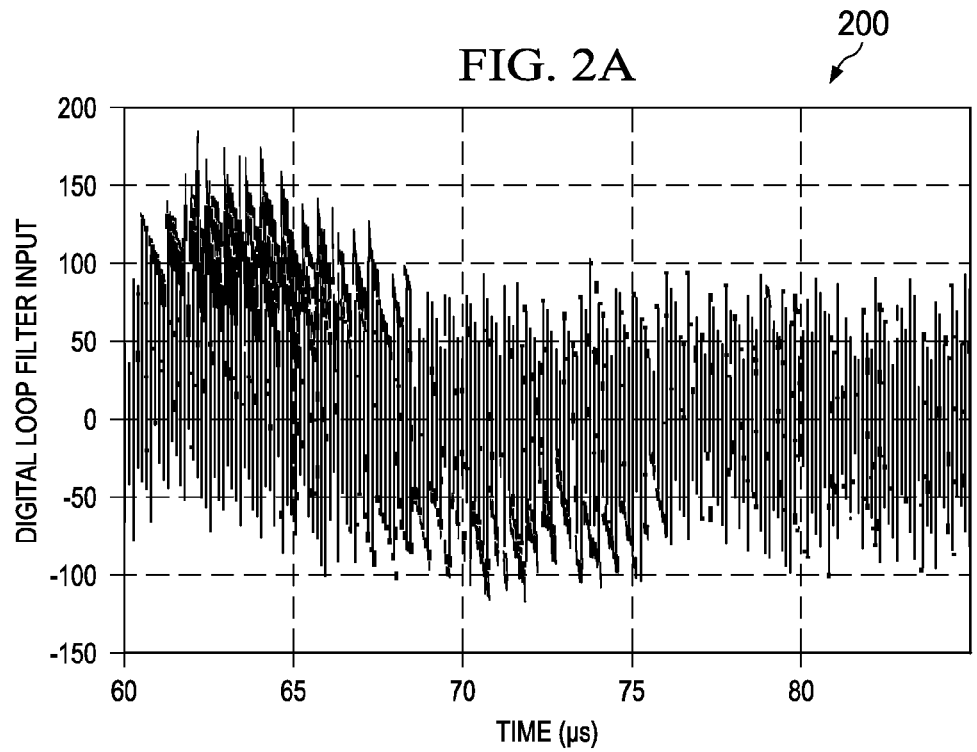
Figure 2B:
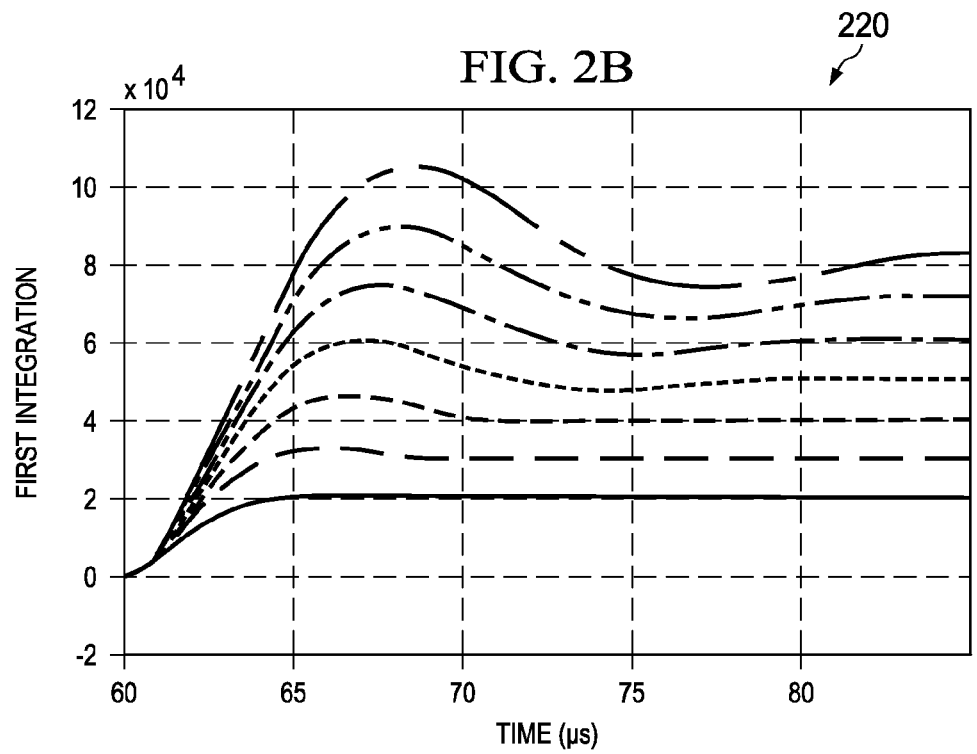

FIGS. 2A, 2B and 2C illustrate examples of calibration waveforms, generally designated 200, 220, 240 as may be generated in a PLL, such as the PLL 100 of FIG. 1 during a calibration operation. FIG. 2A shows an input calibration waveform 200 as may be provided to a digital integration stage of a digital bandwidth calibration unit soon after a unit step calibration signal has been applied to the PLL.

FIG. 2B shows resulting calibration waveforms 220, corresponding to the input calibration waveform 200, as may be provided after a first integration of the digital integration stage for seven different loop bandwidth settings. The resulting calibration waveforms 220 show enablement of the first integration after 60 microseconds for a time period of 25 microseconds.

FIG. 2C shows resulting calibration waveforms 240, corresponding to the input calibration waveform 200, as may be provided after a double integration of the digital integration stage for the seven different loop bandwidth settings of FIG. 2B. The resulting calibration waveforms 240 also show enablement of the double integration after 60 microseconds for a time period of 25 microseconds.

FIG. 3 illustrates an example of a required gain correction, generally designated 300, as a function of the double integration result shown in FIG. 2C for the time period of 25 microseconds. For a given double integration result, the corresponding digital gain correction value on the vertical axis is the correction factor that needs to be applied to the digital gain to set the PLL bandwidth to its required or target nominal value.

Additionally, FIG. 3 shows that the required gain correction 300 is directly proportional to the double integration result. The slope of the required gain correction 300 is a function of the target bandwidth, the offset used for unit-step input and the total time duration of the double integration. Even though the required gain correction 300 appears to be a linear function, a practical gain correction curve will often not be perfectly linear because of various impairments, which are not modeled in these simulations. Therefore, a calibration look-up table may typically be employed to ensure better overall accuracy.

Figure 4:
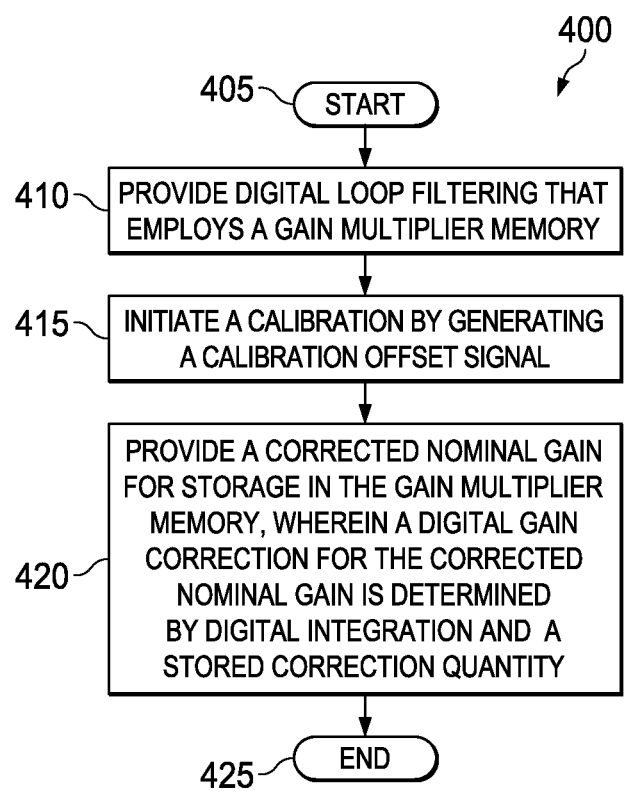
FIG. 4 illustrates a flow diagram of an embodiment of a phase-locked loop digital bandwidth calibration method carried out according to the principles of the present disclosure.

FIG. 4 illustrates a flow diagram of an embodiment of a phase-locked loop digital bandwidth calibration method, generally designated 400, carried out according to the principles of the present disclosure. The method 400 starts in a step 405, and digital loop filtering is provided that employs a gain multiplier memory, in a step 410. Then, a calibration is initiated by generating a calibration offset signal, in a step 415. A corrected nominal gain for storage in the gain multiplier memory is provided, wherein a digital gain correction for the corrected nominal gain is determined by digital integration and a stored correction quantity, in a step 420.

In one embodiment, an initial loop gain is set to a value that is larger than a nominal loop gain. Correspondingly, the initial loop gain may be set to a value that is about four times the nominal loop gain. In another embodiment, the calibration offset signal is applied as a step function and is selected from the group consisting of a frequency offset and a division ratio in a feedback divider. In yet another embodiment, the digital integration corresponds to a double integration of an input signal of the digital loop filtering, and the stored correction quantity is provided by a slope look-up table.

In still another embodiment, the digital integration and the stored correction quantity are employed in a first calibration multiplication to generate the digital gain correction. Additionally, a second calibration multiplication provides the corrected nominal gain using the digital gain correction and a nominal gain. Correspondingly, the corrected nominal gain or the nominal gain is provided to the gain multiplier memory. The method 400 ends in a step 425.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A phase-locked loop digital bandwidth calibrator, comprising:
    a digital loop filter having a gain multiplier memory;
    a perturbation unit configured to generate a calibration offset signal to initiate a calibration;
    a digital bandwidth calibration unit configured to provide a corrected nominal gain for storage in the gain multiplier memory, wherein a digital gain correction for the corrected nominal gain is determined by a digital integration stage and a correction database, wherein the digital integration stage is configured to provide a double integration of an input signal of the digital loop filter.

2. The calibrator as recited in claim 1 wherein the calibration offset signal is selected from the group consisting of:
   a frequency offset; and
   a division ratio in a feedback divider.

3. The calibrator as recited in claim 1 wherein the calibration offset signal corresponds to a step function.

4. The calibrator as recited in claim 1 wherein the correction database is provided by a slope look-up table.

5. The calibrator as recited in claim 1 wherein the digital integration stage and the correction database are configured to provide outputs to a first calibration multiplier to generate the digital gain correction.

6. The calibrator as recited in claim 5 wherein a second calibration multiplier is configured to provide the corrected nominal gain employing the digital gain correction and a nominal gain.

7. The calibrator as recited in claim 6 wherein a calibration multiplexer is configured to provide the corrected nominal gain or the nominal gain to the gain multiplier memory.

8. The calibrator as recited in claim 1 wherein an initial loop gain of the digital loop filter is set to a value that is larger than a nominal loop gain.

9. The calibrator as recited in claim 8 wherein the initial loop gain is set to a value that is about four times the nominal loop gain.

10. A phase-locked loop digital bandwidth calibration method, comprising:
    providing digital loop filtering that employs a gain multiplier memory;
    initiating a calibration by generating a calibration offset signal;
    providing a corrected nominal gain for storage in the gain multiplier memory, wherein a digital gain correction for the corrected nominal gain is determined by digital integration and a stored correction quantity, wherein the digital integration corresponds to a double integration of an input signal of the digital loop filtering.

11. The method as recited in claim 10 wherein the calibration offset signal is selected from the group consisting of:
    a frequency offset; and
    a division ratio in a feedback divider.

12. The method as recited in claim 10 wherein the calibration offset signal is applied as a step function.

13. The method as recited in claim 10 wherein the stored correction quantity is provided by a slope look-up table.

14. The method as recited in claim 10 wherein the digital integration and the stored correction quantity are employed in a first calibration multiplication to generate the digital gain correction.

15. The method as recited in claim 14 wherein a second calibration multiplication provides the corrected nominal gain using the digital gain correction and a nominal gain.

16. The method as recited in claim 15 wherein the corrected nominal gain or the nominal gain is provided to the gain multiplier memory.

17. The method as recited in claim 10 wherein an initial loop gain is set to a value that is larger than a nominal loop gain.

18. The method as recited in claim 17 wherein the initial loop gain is set to a value that is about four times the nominal loop gain.

* * * * *